(12) United States Patent
Chen

(10) Patent No.: US 11,189,771 B2
(45) Date of Patent: Nov. 30, 2021

(54) BREATHABLE MICRO LIGHT EMITTING DIODE DISPLAY

(71) Applicant: MIKRO MESA TECHNOLOGY CO., LTD., Apia (WS)

(72) Inventor: Li-Yi Chen, Tainan (TW)

(73) Assignee: MIKRO MESA TECHNOLOGY CO., LTD., Apia (WS)

(*) Notice: Subject to any disclaimer, the term of this patent is extended or adjusted under 35 U.S.C. 154(b) by 50 days.

(21) Appl. No.: 16/711,417

(22) Filed: Dec. 11, 2019

(65) Prior Publication Data

US 2021/0184093 A1    Jun. 17, 2021

(51) Int. Cl.
| | | |
|---|---|---|
| *H01L 33/64* | (2010.01) | |
| *H01L 33/52* | (2010.01) | |
| *H01L 25/075* | (2006.01) | |
| *H01L 33/62* | (2010.01) | |
| *G06F 1/16* | (2006.01) | |

(52) U.S. Cl.
CPC ........ *H01L 33/648* (2013.01); *H01L 25/0753* (2013.01); *H01L 33/52* (2013.01); *H01L 33/62* (2013.01); *G06F 1/163* (2013.01)

(58) Field of Classification Search
CPC ....... H01L 33/648; H01L 33/52; H01L 33/62; H01L 25/0753; G06F 1/163
See application file for complete search history.

(56) References Cited

U.S. PATENT DOCUMENTS

| 10,312,466 B2* | 6/2019 | Jiang | H01L 51/52 |
| 2016/0181347 A1* | 6/2016 | Lou | H01L 27/326 |
| | | | 257/40 |
| 2020/0044127 A1* | 2/2020 | Ahn | H01L 33/62 |
| 2020/0185368 A1* | 6/2020 | Park | H01L 33/62 |
| 2020/0395510 A1* | 12/2020 | Bower | H01L 33/62 |
| 2021/0074897 A1* | 3/2021 | Kim | H01L 25/0753 |
| 2021/0123170 A1* | 4/2021 | Diaz | A41C 3/0014 |
| 2021/0184422 A1* | 6/2021 | Chen | H01S 5/02234 |

* cited by examiner

*Primary Examiner* — Victor A Mandala
(74) *Attorney, Agent, or Firm* — CKC & Partners Co., LLC

(57) ABSTRACT

A micro light emitting diode display includes a substrate, an electrode layer and a micro light emitting diode device. The substrate has a first surface, a second surface opposite to the first surface, and at least one air passage extending from the first surface to the second surface. The electrode layer is disposed on and in contact with the first surface of the substrate. The air passage has an opening on the first surface of the substrate, and the electrode layer is spaced apart from the opening. The micro light emitting diode device is disposed on the electrode layer and has a light emitting area that is less than or equal to 2500 $\mu m^2$.

13 Claims, 6 Drawing Sheets

A-A'

BREATHABLE MICRO LIGHT EMITTING DIODE DISPLAY

BACKGROUND

Technical Field

The present disclosure relates to a breathable micro light emitting diode display.

Description of Related Art

The statements in this section merely provide background information related to the present disclosure and do not necessarily constitute prior art.

In recent years, wearable electronic devices have grown rapidly in popularity. The comfort of wearable electronic devices is of crucial importance to the overall user experience and user satisfaction, especially for wearable devices with a display for presentation of digital information.

SUMMARY

In accordance with an embodiment of the present disclosure, a micro light emitting diode display includes a substrate, an electrode layer and a micro light emitting diode device. The substrate has a first surface, a second surface opposite to the first surface, and at least one air passage extending from the first surface to the second surface. The electrode layer is disposed on and in contact with the first surface of the substrate. The air passage has an opening on the first surface of the substrate, and the electrode layer is spaced apart from the opening. The micro light emitting diode device is disposed on the electrode layer and has a light emitting area that is less than or equal to 2500 $\mu m^2$. With such a structural configuration, the micro light emitting diode display of the present disclosure is "breathable" and can thus be utilized in wearable devices to deliver a pleasant wearing experience.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
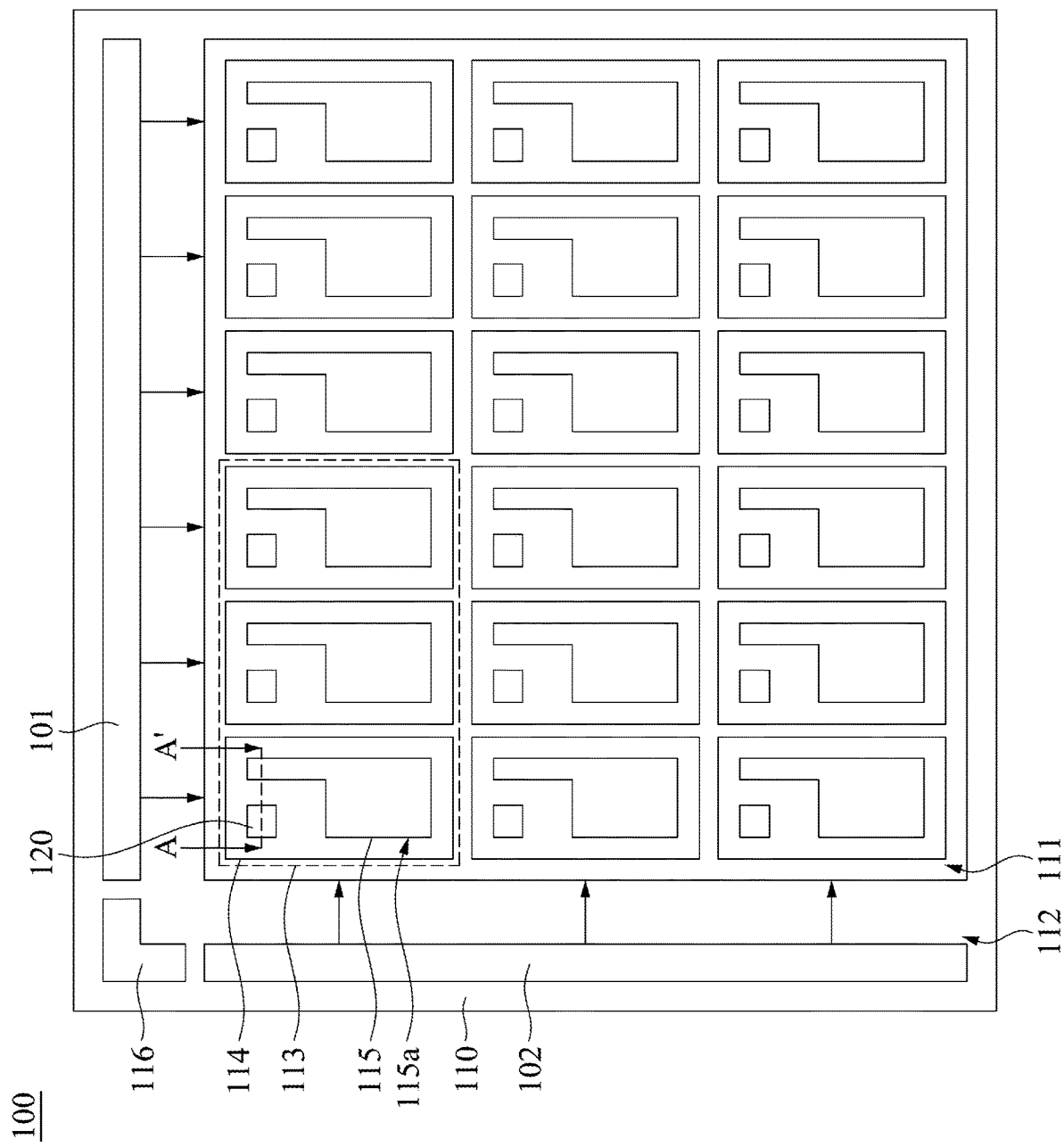
FIG. 1 illustrates a top view of a micro light emitting diode display in accordance with an embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

In various embodiments, description is made with reference to figures. However, certain embodiments may be practiced without one or more of these specific details, or in combination with other known methods and configurations. In the following description, numerous specific details are set forth, such as specific configurations, dimensions, and processes, etc., in order to provide a thorough understanding of the present disclosure. In other instances, well-known semiconductor processes and manufacturing techniques have not been described in particular detail in order to not unnecessarily obscure the present disclosure. Reference throughout this specification to "one embodiment," "an embodiment", "some embodiments" or the like means that a particular feature, structure, configuration, or characteristic described in connection with the embodiment is included in at least one embodiment of the disclosure. Thus, the appearances of the phrase "in one embodiment," "in an embodiment", "in some embodiments" or the like in various places throughout this specification are not necessarily referring to the same embodiment of the disclosure. Furthermore, the particular features, structures, configurations, or characteristics may be combined in any suitable manner in one or more embodiments.

The terms "over," "to," "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Reference is made to FIG. 1, which illustrates a top view of a micro light emitting diode display 100 in accordance with an embodiment of the present disclosure. The micro light emitting diode display 100 includes a substrate 110 and a plurality of micro light emitting diode devices 120 disposed on the substrate 110. The substrate 110 includes a display region 111 having a plurality of pixel units 113 therein and a non-display region 112 outside of the display region 111. The pixel units 113 are arranged in a matrix, and each of the pixel units 113 includes a plurality of subpixels 114. Each of the micro light emitting diode devices 120 is disposed in one of the subpixels 114. In some embodiments, the substrate 110 includes plastic. In some embodiments, the substrate 110 is a flexible substrate. In some embodiments, each of the micro light emitting diode devices 120 has a light emitting area that is less than or equal to 2500 $\mu m^2$. In some embodiments, each of the micro light emitting diode devices 120 has a lateral length that is less than or equal to 50 $\mu m$.

As shown in FIG. 1, the micro light emitting diode display 100 further includes a data driver circuit 101 and a scan driver circuit 102, both of which are disposed on the substrate 110 and located in the non-display region 112. The data driver circuit 101 is electrically connected to data lines of the subpixels 114 and is configured to transmit data signals to the subpixels 114. The scan driver circuit 102 is electrically connected to scan lines of the subpixels 114 and is configured to transmit scan signals to the subpixels 114.

Figure 2:
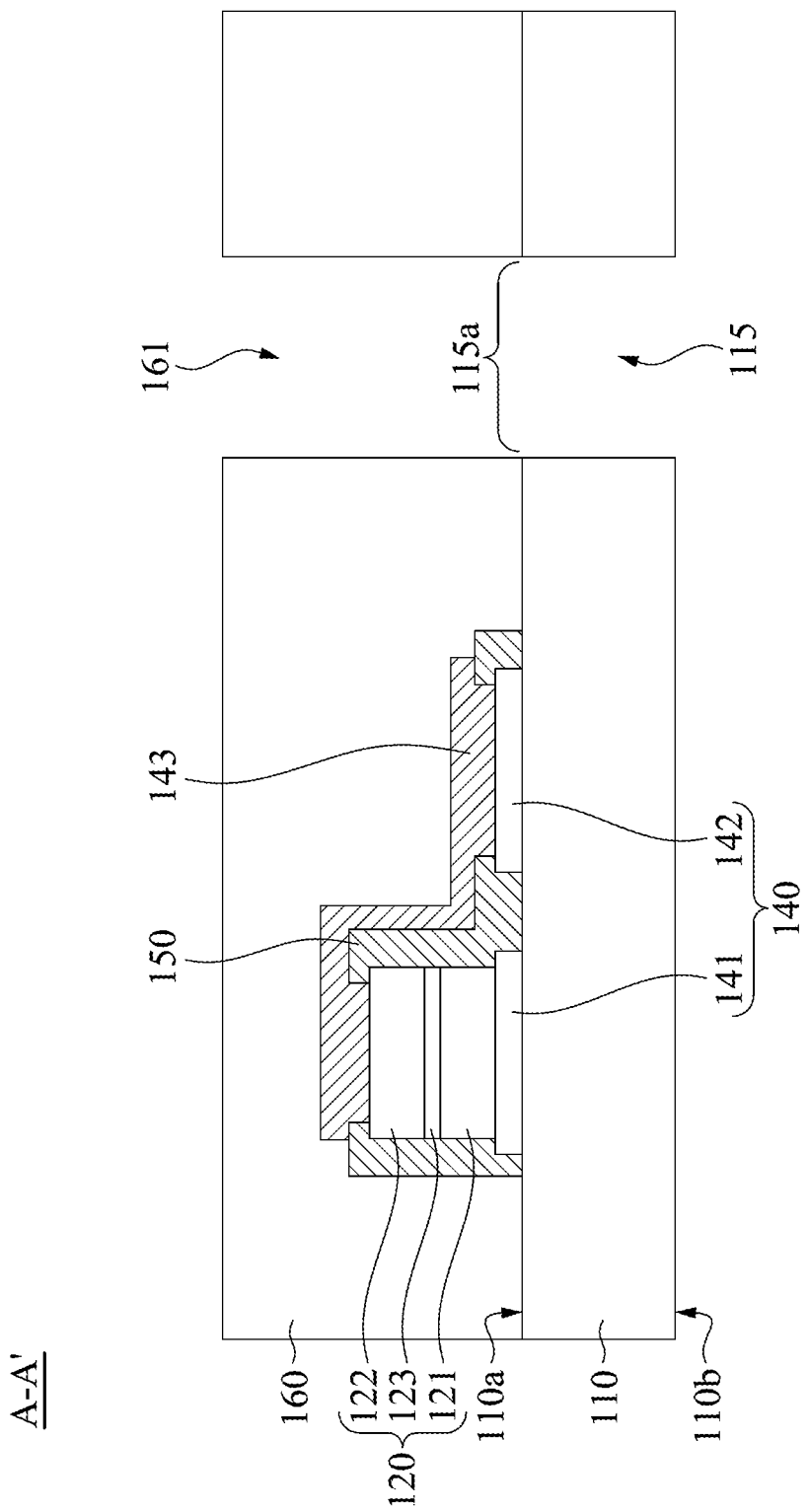
FIG. 2 illustrates a partially enlarged cross-sectional view of the micro light emitting diode display shown in FIG. 1 taken along line segment A-A'.

Reference is made to FIG. 2, which illustrates a partially enlarged cross-sectional view of the micro light emitting diode display 100 shown in FIG. 1 taken along line segment A-A'. The substrate 110 has a first surface 110a and a second surface 110b opposite to the first surface 110a. The micro light emitting diode display 100 further includes an electrode layer 140 disposed on and in contact with the first surface 110a of the substrate 110. The micro light emitting diode device 120 is disposed on the electrode layer 140. Specifically, the electrode layer 140 is deposited on the first surface 110a of the substrate 110 and includes a first electrode 141 and a second electrode 142. The first electrode 141 and the second electrode 142 are separated and are electrically insulated from each other.

As shown in FIG. 2, in the present embodiment, the micro light emitting diode device 120 is a vertical type light emitting diode. The micro light emitting diode device 120 includes a first type semiconductor layer 121 (e.g., a p-type semiconductor layer), an active layer 123 (e.g., one or more quantum well) and a second type semiconductor layer 122 (e.g., an n-type semiconductor layer) in a stack arrangement. The first type semiconductor layer 121 and the second type semiconductor layer 122 are joined to each other with the active layer 123 interposed therebetween. In some embodiments, the micro light emitting diode device 120 is a laser diode.

As shown in FIG. 2, the first type semiconductor layer 121 is in contact with the first electrode 141 of the electrode layer 140. The second type semiconductor layer 122 is electrically connected to the second electrode 142 of the electrode layer 140 via a top electrode 143. The top electrode 143 is at least partially transparent and is transmissive at least to visible light. In some embodiments, the top electrode 143 includes transparent conductive materials such as indium-tin-oxide (ITO). In some embodiments, the micro light emitting diode display 100 further includes an isolation layer 150 covering the sidewalls of the micro light emitting diode device 120. The isolation layer 150 is partially arranged between the first electrode 141, the second electrode 142 and the top electrode 143 to isolate the first electrode 141 from the second electrode 142 and the top electrode 143.

As shown in FIG. 2, the substrate 110 has at least one air passage 115 extending from the first surface 110a to the second surface 110b. The air passage 115 has an opening 115a on the first surface 110a of the substrate 110, and the electrode layer 140 is spaced apart from the opening 115a. The formation of the air passage 115 enables air to flow through the micro light emitting diode display 100, making the micro light emitting diode display 100 "breathable".

As shown in FIG. 2, in the present embodiment, the air passage 115 is a through hole running through the substrate 110. In the present embodiment, the though hole is located within one of the pixel units 113, and more specifically, the though hole is located within one of the subpixels 114. Accordingly, an area enclosed by a circumference of the opening 115a is less than an area of the corresponding subpixel 114. In some embodiments, the though hole is formed by dissolving part of the substrate 110 with suitable solvent.

In some embodiments, the substrate 110 includes at least ten through holes to attain desirable air permeability. In some embodiments, an area enclosed by a circumference of the opening 115a of the air passage 115 is less than 2 mm$^2$. With such a size configuration, the micro light emitting diode display 100 can remain visually "complete" while being breathable, as the through hole (i.e., the air passage 115) of said dimension is hardly visible to the naked eye. In some embodiments, the area enclosed by the circumference of the opening 115a of the air passage 115 is preferably less than 0.5 mm$^2$.

In some embodiments, each of the subpixels 114 has at least one through hole (i.e., the air passage 115) formed therein. In some embodiments, at least one of the subpixels 114 is not air permeable (i.e., having no through hole formed therein). In some embodiments, at least one of the subpixels 114 has multiple through holes formed therein. In some embodiments, the substrate 110 has a plurality of air passages 115, and a total area enclosed by circumferences of the openings 115a of the air passages 115 occupies 3% to 90% of an area enclosed by a circumference of the first surface 110a of the substrate 110.

The through holes of the substrate 110 are not limited to be located within the pixel units 113 or the subpixels 114. In some embodiments, the substrate 110 includes at least one through hole in a non-emitting area of the display region 111, which may be located between the pixel units 113 (i.e., the non-emitting area separates the pixel units 113).

As shown in FIG. 1, the through holes of the substrate 110 are not limited to be located within the display region 111. In some embodiments, the substrate 110 further includes at least one through hole 116 located within the non-display region 112 and spaced apart from the data driver circuit 101, the scan driver circuit 102, and any conductive trace in the non-display region 112.

As shown in FIG. 2, in some embodiments, the micro light emitting diode display 100 further includes an encapsulation layer 160 covering the substrate 110, the electrode layer 140, the micro light emitting diode device 120, the top electrode 143, and the isolation layer 150. The encapsulation layer 160 has a through hole 161 in fluid communication with the though hole of the substrate 110 (i.e., the air passage 115), allowing air to flow through the micro light emitting diode display 100 via the through hole of the substrate 110 (i.e., the air passage 115) and the through hole 161 of the encapsulation layer 160. The through hole 161 is spaced apart from the electrode layer 140, the micro light emitting diode device 120, the top electrode 143, and the isolation layer 150. In some embodiments, the through hole 161 of the encapsulation layer 160 and the though hole of the substrate 110 (i.e., the air passage 115) are aligned and are of substantially equal diameter.

Figure 3:
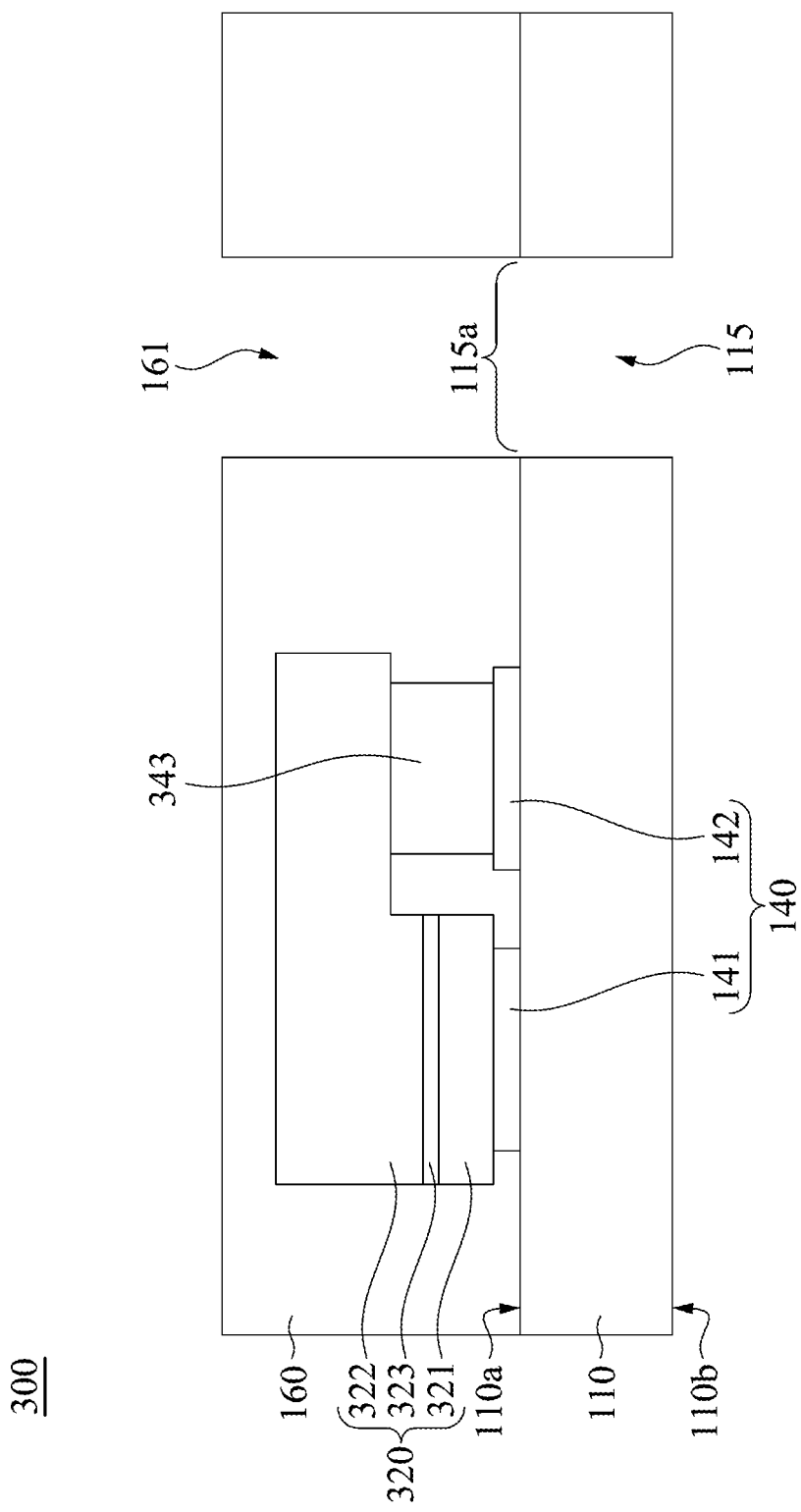
FIG. 3 illustrates a partially enlarged cross-sectional view of a micro light emitting diode display in accordance with another embodiment of the present disclosure.

Reference is made to FIG. 3, which illustrates a partially enlarged cross-sectional view of a micro light emitting diode display 300 in accordance with another embodiment of the present disclosure. The present embodiment differs from the embodiment shown in FIG. 2 in that the micro light emitting diode device 320 of the micro light emitting diode display 300 is a flip chip light emitting diode. Specifically, the micro light emitting diode device 320 includes a first type semiconductor layer 321, a second type semiconductor layer 322, and an active layer 323. The first type semiconductor layer 321 and the second type semiconductor layer 322 are joined to each other with the active layer 323 interposed therebetween.

As shown in FIG. 3, the first type semiconductor layer 321 is in contact with the first electrode 141 of the electrode layer 140. The second type semiconductor layer 322 laterally extends over the second electrode 142 of the electrode layer 140. The second type semiconductor layer 322 is electrically connected to the second electrode 142 of the electrode layer 140 via an electrical contact 343 located between the second type semiconductor layer 332 and the second electrode 142 of the electrode layer 140. The encapsulation layer 160 covers the substrate 110, the electrode layer 140, the micro light emitting diode device 320, and the electrical contact 343.

Figure 4:
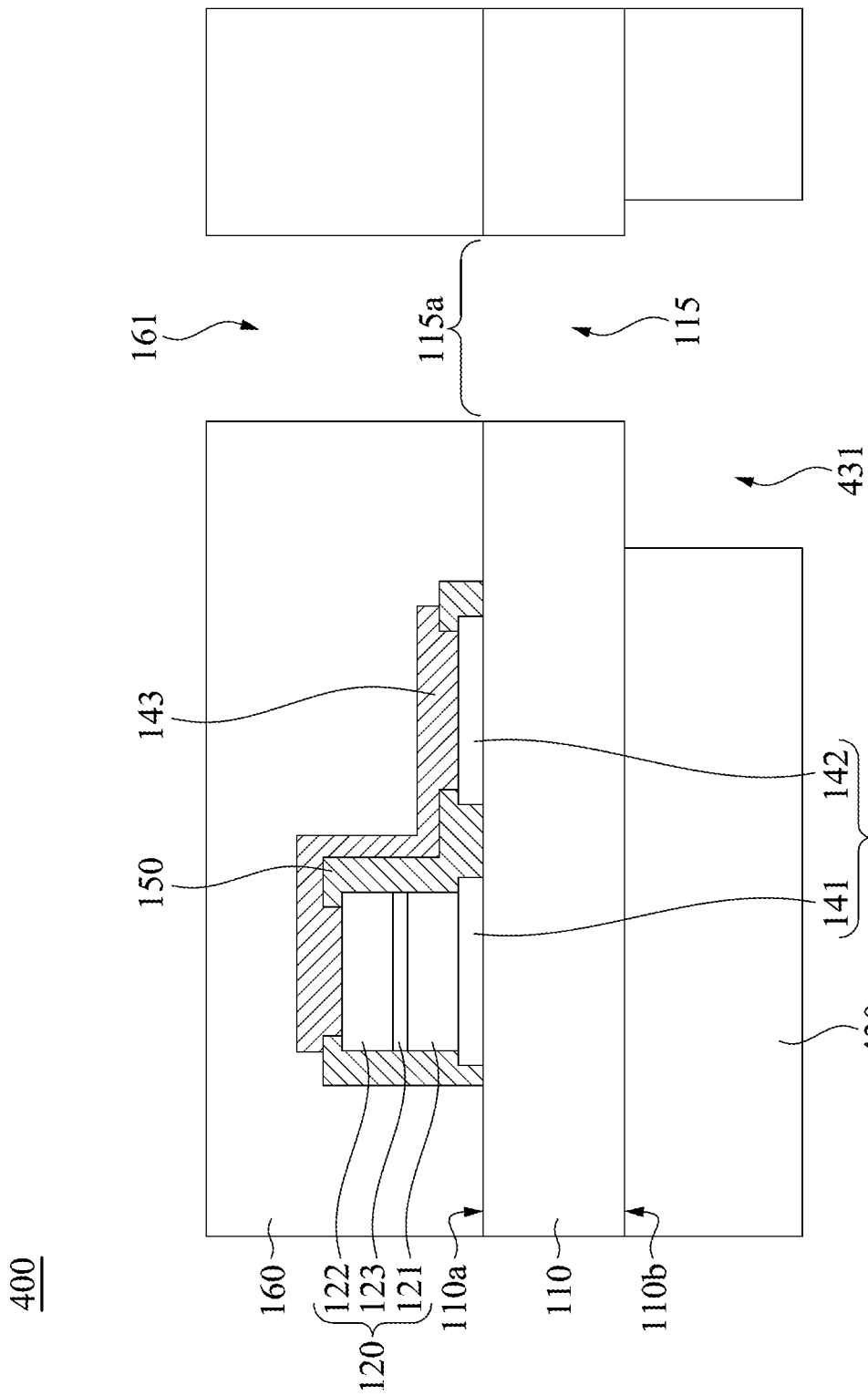
FIG. 4 illustrates a partially enlarged cross-sectional view of a micro light emitting diode display in accordance with another embodiment of the present disclosure.

Reference is made to FIG. 4, which illustrates a partially enlarged cross-sectional view of a micro light emitting diode display 400 in accordance with another embodiment of the present disclosure. The present embodiment differs from the embodiment shown in FIG. 2 in that the micro light emitting diode display 400 further includes an air permeable support layer 430. The air permeable support layer 430 at least partially covers the second surface 110b of the substrate 110. In general, it is desirable to keep the substrate 110 thin to facilitate the formation of the through hole (i.e., the air passage 115). The air permeable support layer 430 can thus provide structural support for the substrate 110.

As shown in FIG. 4, the air permeable support layer 430 has at least one through hole 431 in fluid communication with the air passage 115 (e.g., a through hole), allowing air to flow through the micro light emitting diode display 400 via the through hole 431 of the air permeable support layer 430, the through hole of the substrate 110 (i.e., the air passage 115), and the through hole 161 of the encapsulation layer 160. In some embodiments, the air permeable support layer 430 includes fabrics.

Figure 5:
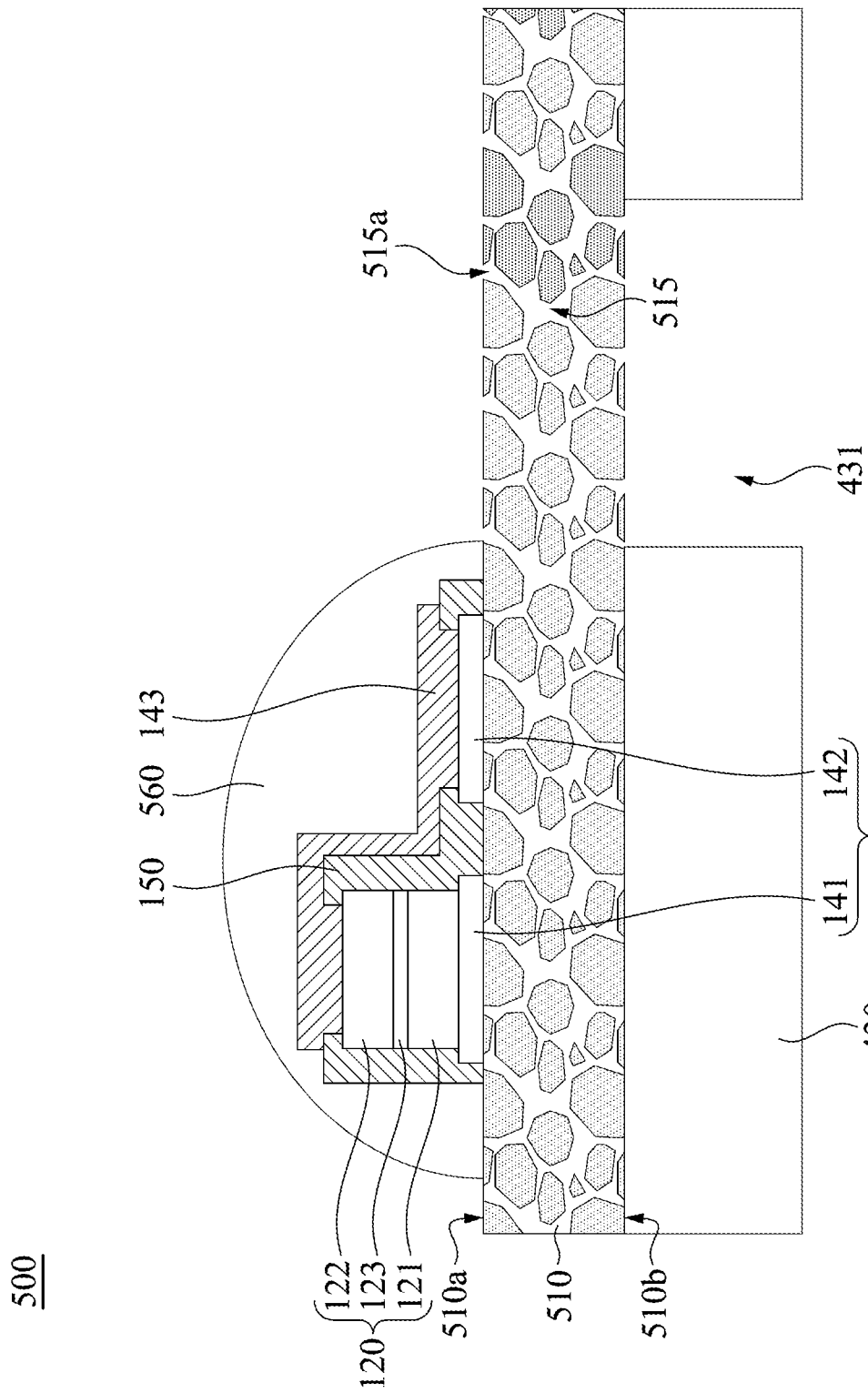
FIG. 5 illustrates a partially enlarged cross-sectional view of a micro light emitting diode display in accordance with another embodiment of the present disclosure.

Reference is made to FIG. 5, which illustrates a partially enlarged cross-sectional view of a micro light emitting diode display 500 in accordance with another embodiment of the present disclosure. The present embodiment differs from the embodiment shown in FIG. 2 in that the substrate 510 of the micro light emitting diode display 500 includes a porous material. The porous material has pores that form the air passage 515 of the substrate 510. In some embodiments, the porous material includes plastic, ceramic, fabric, composite material, other suitable materials, or any combination thereof.

As shown in FIG. 5, the encapsulation layer 560 of the micro light emitting diode display 500 covers the micro light emitting diode device 120, the electrode layer 140, the top electrode 143, and the isolation layer 150, and exposes at least a part of the first surface 510a of the substrate 510. The air passage 515 has at least one opening 515a on the first surface 510a of the substrate 510 and spaced apart from the encapsulation layer 560 and the components embedded therein. In other words, the air passage 515 has at least one opening 515a at the exposed part of the first surface 510a of the substrate 510.

As shown in FIG. 5, in some embodiments, the micro light emitting diode display 500 further includes the air permeable support layer 430. The air permeable support layer 430 at least partially covers the second surface 510b of the substrate 510 (which is opposite to the first surface 510a). The air permeable support layer 430 has at least one through hole 431 in fluid communication with the air passage 515 (e.g., the pores), allowing air to flow through the micro light emitting diode display 500 via the through hole 431 of the air permeable support layer 430 and the pores of the substrate 510. The through hole 431 of the air permeable support layer 430 is at least partially located beneath the exposed part of the first surface 510a of the substrate 510 (i.e., the part of the first surface 510a that is not covered by the encapsulation layer 560).

Figure 6:
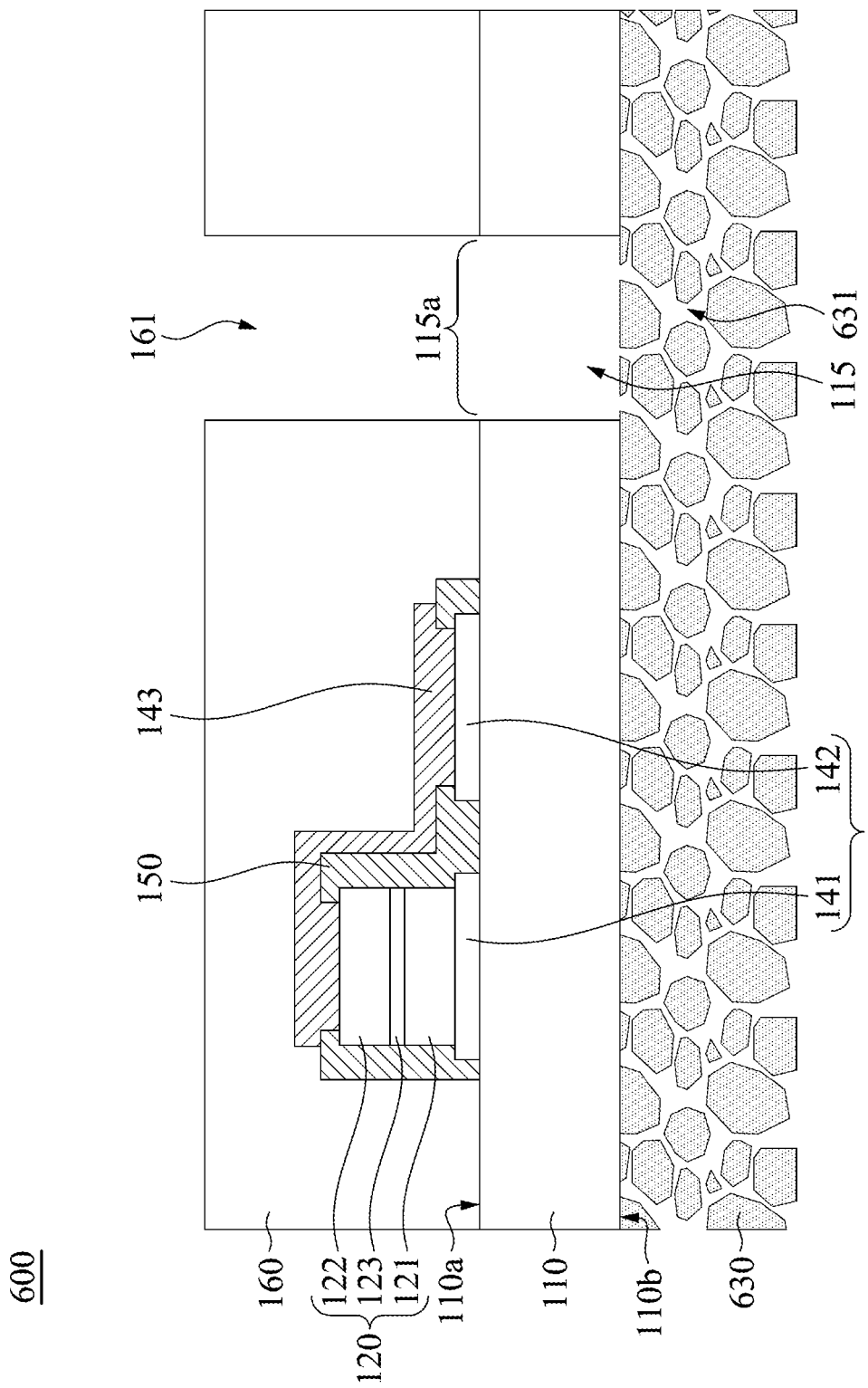
FIG. 6 illustrates a partially enlarged cross-sectional view of a micro light emitting diode display in accordance with another embodiment of the present disclosure.

Reference is made to FIG. 6, which illustrates a partially enlarged cross-sectional view of a micro light emitting diode display 600 in accordance with another embodiment of the present disclosure. The present embodiment differs from the embodiment shown in FIG. 2 in that the micro light emitting diode display 600 further includes an air permeable support layer 630. The air permeable support layer 630 at least partially covers the second surface 110b of the substrate 110 and includes a porous material. The porous material includes pores that form at least one air passage 631, allowing air to flow through the micro light emitting diode display 600 via pores of the air permeable support layer 630, the through hole of the substrate 110 (i.e., the air passage 115), and the through hole 161 of the encapsulation layer 160. In some embodiments, the porous material includes plastic, ceramic, fabric, composite material, other suitable materials, or any combination thereof.

In sum, embodiments of the present disclosure provide a "breathable" micro light emitting diode display either by forming through holes in the substrate or using substrate made of porous materials to allow air to flow through, so that the "breathable" micro light emitting diode display can be utilized in wearable devices to deliver a pleasant wearing experience.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A micro light emitting diode display, comprising:
    a substrate having a first surface, a second surface opposite to the first surface, and at least one air passage extending from the first surface to the second surface, wherein the at least one air passage comprises a first through hole that runs through the substrate;
    an electrode layer disposed on and in contact with the first surface of the substrate, wherein the at least one air passage has an opening on the first surface of the substrate, and the electrode layer is spaced apart from the opening;
    a micro light emitting diode device disposed on the electrode layer and having a light emitting area that is less than or equal to 2500 $\mu m^2$; and
    an encapsulation layer covering the substrate, the electrode layer and the micro light emitting diode device, the encapsulation layer having a second through hole, the second through hole being in fluid communication with the first though hole of the substrate.

2. The micro light emitting diode display of claim 1, wherein the first through hole is located within a display region of the substrate.

3. The micro light emitting diode display of claim 2, wherein the micro light emitting diode device and the first through hole are located within a pixel unit of the display region.

4. The micro light emitting diode display of claim 1, further comprising:
    an air permeable support layer at least partially covering the second surface of the substrate.

5. The micro light emitting diode display of claim 4, wherein the air permeable support layer has at least one through hole in fluid communication with the at least one air passage.

6. The micro light emitting diode display of claim 4, wherein the air permeable support layer comprises fabrics.

7. The micro light emitting diode display of claim 1, wherein the at least one air passage is plural in number, and a total area enclosed by circumferences of the openings of the air passages occupies 3% to 90% of an area enclosed by a circumference of the first surface of the substrate.

8. The micro light emitting diode display of claim 1, wherein the electrode layer is deposited on the first surface of the substrate.

9. The micro light emitting diode display of claim 1, wherein the micro light emitting diode device comprises a first type semiconductor layer, an active layer, and a second type semiconductor layer in a stack arrangement, the first type semiconductor layer is in contact with the electrode layer, the second type semiconductor layer is electrically connected to the electrode layer via a top electrode, and the top electrode is at least partially transparent.

10. The micro light emitting diode display of claim 1, wherein the micro light emitting diode device comprises a first type semiconductor layer, a second type semiconductor layer, and an active layer interposed between the first type semiconductor layer and the second type semiconductor layer, the first type semiconductor layer is in contact with the electrode layer, the second type semiconductor layer is electrically connected to the electrode layer via an electrical contact located between the second type semiconductor layer and the electrode layer.

11. The micro light emitting diode display of claim 1, wherein the micro light emitting diode device is a laser diode.

12. The micro light emitting diode display of claim 1, wherein an area enclosed by a circumference of the opening of the at least one air passage is less than 2 $mm^2$.

13. The micro light emitting diode display of claim 1, wherein the at least one air passage comprises at least ten through holes running through the substrate.

* * * * *